(12) United States Patent
Aho et al.

(10) Patent No.: US 6,181,211 B1
(45) Date of Patent: Jan. 30, 2001

(54) AUTOMATIC TUNING OF A VCO IN A PLL

(75) Inventors: Jarmo Aho, Klaukkala; Antti Kivijärvi, Espoo, both of (FI)

(73) Assignee: Nokia Networks OY, Espoo (FI)

( * ) Notice: Under 35 U.S.C. 154(b), the term of this patent shall be extended for 0 days.

(21) Appl. No.: 09/525,181

(22) Filed: Mar. 14, 2000

Related U.S. Application Data

(63) Continuation of application No. PCT/FI98/00757, filed on Sep. 24, 1998.

Foreign Application Priority Data

Sep. 24, 1977 (FI) .......................................... 973771

(51) Int. Cl.[7] .............................. H03L 7/087; H03L 7/093
(52) U.S. Cl. ................................. 331/11; 331/16; 331/17; 331/25
(58) Field of Search .................................. 331/10, 11, 16, 331/17, 25

(56) References Cited

U.S. PATENT DOCUMENTS

| | | | |
|---|---|---|---|
| 4,855,683 | 8/1989 | Troudet et al. | 331/1 A |
| 5,525,935 | * 6/1996 | Joo et al. | 331/11 |
| 5,619,484 | 4/1997 | Yokota et al. | 369/50 |
| 5,786,733 | * 7/1998 | Yamaguchi | 331/11 |

FOREIGN PATENT DOCUMENTS

| | | |
|---|---|---|
| 2 113 929 | 8/1983 | (GB) . |
| 2 120 478 | 11/1983 | (GB) . |
| 2 265 284 | 9/1993 | (GB) . |
| 2 293 063 | 3/1996 | (GB) . |
| 2 311 178 | 9/1997 | (GB) . |
| 89/05065 | 6/1989 | (WO) . |

* cited by examiner

*Primary Examiner*—Siegfried H. Grimm
(74) *Attorney, Agent, or Firm*—Altera Law Group, LLC

(57) ABSTRACT

In a phase locked loop, when seeking loop locking the control variable (S2) arriving from the loop filter (54) is not admitted as such to the oscillator's (55) control input, but it is attenuated so that it will vary within a small range at the middle of its range of variation. At the same time, the loop's output frequency ($f_{VCO}$) is compared to the frequency of an external frequency source (53), which is sufficiently close to the nominal frequency of the input signal. When the regulating element finds that the oscillator's output frequency is not in a predetermined frequency window, it will add to or reduce the additional control (VCO Cntrl) which it supplies to the oscillator's control input. When the oscillator's (55) frequency has entered the frequency window, the additional control is frozen and the attenuation is removed from the control variable (S2) arriving from the loop filter. The loop will thus perform phase locking very quickly to the loop's input signal and, in addition, the locking takes place in the middle of the oscillator's range of regulation.

22 Claims, 3 Drawing Sheets

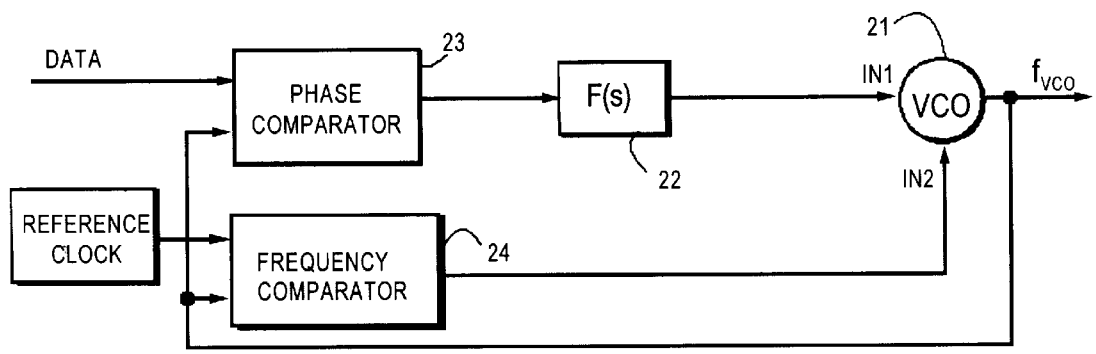
FIG. 2 *PRIOR ART*
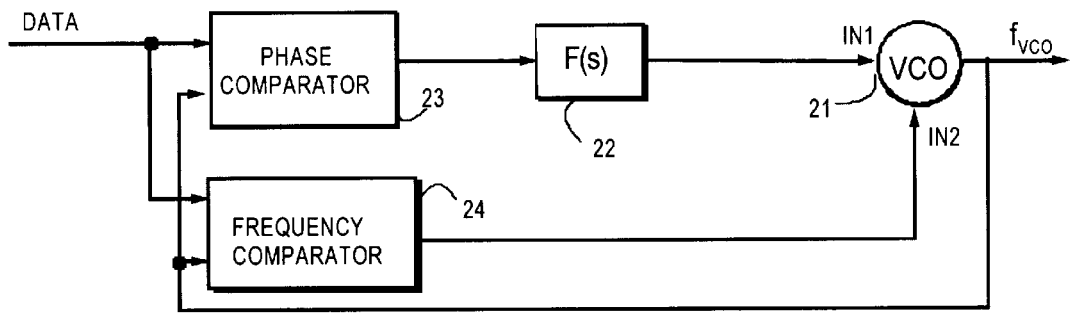
FIG. 3 *PRIOR ART*
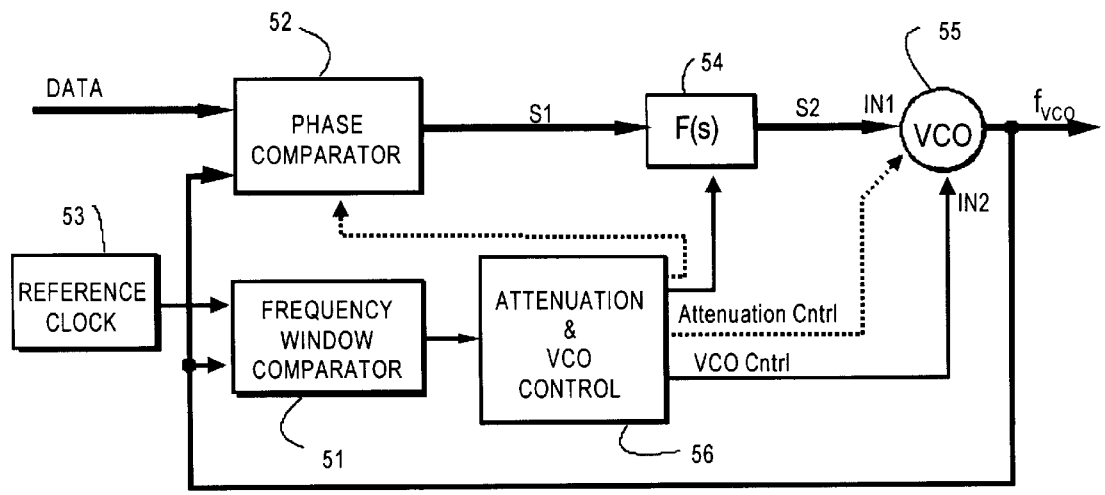
FIG. 4

AUTOMATIC TUNING OF A VCO IN A PLL

This application is a continuation of international application ser. No. PCT/FI98100757, filed Sep. 24, 1998.

FIELD OF THE INVENTION

This invention generally concerns locking to a desired frequency of a frequency generated by a voltage or current controlled oscillator. The invention especially concerns a phase locked loop the output frequency of which must be locked to a received data flow and the locking speed of which must be high while the phase error of the output signal must be small.

BACKGROUND OF THE INVENTION

In telecommunication systems, nodal equipment send and receive data from each other by way of a transmission network connecting the nodes. If the clock of the receiving circuit is not synchronised to the frequency and phase of the arriving data, the data can not be received correctly. The clock frequency of the receiving circuit is formed in almost all cases by a phase locked loop (PLL).

In the telecommunication industry there is a constant demand for phase locked loops PLL having different central frequencies and band widths. A long transmission distance results in a poorer received signal while a distorted input signal makes great demands on the clocks regeneration block. A phase locked loop where a data flow arriving from the network functions as the reference signal must be as immune as possible to any phase noise from the network and the phase noise generated by itself must be insignificant.

The phase lock must preserve the phase of the regenerated clocks in such a way that the decision-making point is at its optimum in the middle of the eye diagram of the arriving data flow. Secondly, in situations where a blackout occurs in the arriving data flow it must be able to maintain the frequency with moderate precision, and thirdly, in a situation where an interrupted data signal returns, the locking time of the phase lock must be as short as possible.

Several different integrated circuits may be used as oscillators for the phase lock. Suitable oscillators are e.g. a ring oscillator and a current controlled balanced relaxation oscillator.

Great demands are made on a PLL oscillator. It must a) have a low phase noise
b) the range of regulation should be large due to production tolerances, and
c) the output frequency should be linearly dependent on the regulation voltage.

Production and assembly costs should also be low, and this is indeed a factor which restricts the complexity of the oscillator from an industrial point of view. These demands are partly contradictory: it is true that a large range of regulation is achieved with a big gain of the oscillator circuit, but at the cost of noise, and correspondingly a small gain will only produce a narrow range of regulation. In a locking state a big gain is required for the locking to take place quickly, but in a locked state a big gain will cause interfering phase noise. A small gain improves phase stability and reduces the noise caused by any signal that may have passed through the filter and that is of the same frequency as the phase reference signal.

The frequency range of an integrated monolithic voltage or current controlled oscillator is of an inexact nature and without any external components and structures affecting the frequency. However, it is not desirable to use any external structures, because, firstly, they add to the total surface area of the system and, secondly, they make the system less reliable.

A moderately exact free running frequency is necessary e.g. to ensure locking of the receiver of telecommunication equipment to the input signal. An exact frequency is also necessary for the reason that the static phase error of input signals to the PLL phase comparator should be as small as possible. A big difference between the input signal and the central frequency of the oscillator will bring about an asymmetric tracking range in the phase lock, whereby without any kind of tuning the integrated VCO is not able to track the frequency of the arriving signal, except only upwards or downwards.

Referring to the curves shown in FIG. 1, the oscillator's operation will also be illustrated. The figure shows with curves the output frequency of the oscillator as a function of the control voltage. Due to the decentralised production process it is not possible to know exactly beforehand which is the characteristic of the individual oscillator. For this reason, the characteristics form a family of curves, and when taking one individual integrated PLL, the only thing known is that the non-linear characteristic of the oscillator is some curve in the family of curves. When in the lower part of the voltage regulation range according to the curve, in the 1.5 V range in the figure, the output frequency changes very slowly and mostly non-linearly when the control voltage changes. In the 1.5V–3V range, the output frequency changes linearly as a function of the voltage and this range is in fact the range of regulation of the oscillator. After the linear range the frequency changes non-linearly. In the topmost curve the central frequency of the oscillator is e.g. $f_c$ and it is in the middle of the linear range at point C, that is, at control voltage 2.2V. On both sides of the central frequency in range $\Delta f$ the operation is still linear. Together the ranges form the oscillator's range of regulation.

It is easy to see the difficulty in practice from the curves in the figure. When the PLL is locked and it produces frequency $f_0$, it is impossible without measurements to know whether the operation is at point B of the lowest curve or at point A of the following curve. If the operation is at point A, the point of operation is close to the lower limit of the control voltage regulation range. When the input signal frequency changes and becomes slightly lower than frequency $f_0$, the loop is no longer able to lock to the input signal.

FIGS. 2 and 3 show some known basic PLL solutions.

In a circuit according to FIG. 2, an oscillator is used, which has two control inputs, which are inputs IN1 and IN2 respectively. Hereby the control signal supplied by phase comparator 23 and filtered by loop filter 22 is taken to input IN1 and the signal supplied by frequency comparator 24 is taken to the other control input IN2 of oscillator 21. The lock is locked with the aid of the frequency comparator and a separate reference clock. After the locking, however, the effect of frequency comparator 24 must be eliminated, because the frequency of the reference clock and the DATA frequency of the input signal are not necessarily exactly the same.

The solution shown in FIG. 3 differs from the solution in FIG. 2 in that no external reference clock is used, whereby the frequency and phase comparator have the same input signals. This circuit requires a complex frequency comparator.

In each solution a problem occurs when the entire PLL is integrated. Hereby the oscillator's characteristic has a divergence as shown in FIG. 1, and it is not possible to know which curve belongs to the concerned oscillator. Hereby when putting the loop into use in some piece of equipment it may happen that the loop will lock but the control voltage is in fact at either side of its range of regulation and the input signals of the phase comparator may be far from their nominal phase difference.

It is an objective of the present invention to provide a PLL circuit especially suitable for integrated circuits which helps the loop to lock to the middle of the range of regulation and with which a sufficiently exact phasing is attained.

The established objective is achieved with a circuit the characteristics of which are presented in the independent claims.

SUMMARY OF THE INVENTION

The invention is based on the insight that during the locking event the loop's control variable arriving from the phase comparator is not admitted as such as the oscillators control voltage, but it is attenuated significantly so that it will vary in a small range close to the value which it has when non-attenuated with the nominal phase difference between input signals.

At the same time, the loop's output frequency is compared in the frequency comparator with the reference frequency, which is close enough to the desired nominal frequency of the input signal. The reference frequency may be the frequency of an external frequency source or the frequency of an arriving signal. The signal indicating the frequency difference is taken to a regulating element, the first output of which is connected to the oscillators control input and the second output of which controls the attenuation of the loop's control variable. The output voltage or current which is obtained from the first output and which controls the oscillator provides the main control of the oscillator during locking. Control is supplied at the same time from the loop's phase comparator, but due to attenuation it has only a minor effect on the oscillator's frequency. When the regulating element finds out that the oscillator's output frequency differs from the reference frequency, it adds to or reduces the control it supplies to the oscillator's control input. The regulating element hereby quickly reaches that value of the output voltage/current which will regulate the oscillator's central frequency sufficiently close to the reference frequency.

When the oscillator's frequency is sufficiently close to the reference frequency, the current or voltage supplied by the regulating element is frozen to the value of that moment. Then the attenuation is removed from the control arriving from the loop's phase comparator. The regulating element has brought about that the control voltage or current corresponding to the oscillator's nominal frequency is in the middle of its linear range of regulation and is approximately similar to the control provided by the phase comparator and filter when non-attenuated and with a nominal phase difference. For this reason, when removing the attenuation, the loop will lock quickly in the middle of the non-attenuated control signal.

With the arrangement according to the invention the vibration tolerance and sensitivity of the phase locked loop is made independent of any divergence in the VCO's range of regulation, because the central frequency is automatically regulated to the nominal frequency. The operation is not dependent on the semiconductor process and any needs for tuning are avoided in connection with the production and use of the integrated circuit.

BRIEF DESCRIPTION OF THE DRAWINGS

The invention will be described in closer detail with the aid of the appended schematic drawings, wherein

FIG. 2 shows a known loop circuit;

FIG. 3 shows another known loop circuit;

FIG. 4 is a schematic view of a circuit according to the invention;

DETAILED DESCRIPTION OF AN EMBODIMENT OF THE INVENTION

FIG. 4 shows a PLL circuit illustrating the invention. This too uses a frequency comparator, and in the figure the output signal of VCO 55 is drawn as the second input signal of frequency comparator 51, while a signal supplied by reference source 53 is the reference signal. In this regard the input signals are the same as in the case shown in FIG. 2. However, the invention does in no way prevent use of the frequency of the data flow arriving at the loop as the reference signal, like in the circuit shown in FIG. 3. The frequency comparator may be either a conventional frequency comparator, which indicates when input signal frequencies are exactly the same, or a window comparator may be used which checks whether the frequency of the VCO output signal is in the frequency window or not.

In the following description an embodiment is described wherein a frequency window comparator is used and the reference signal is obtained from an external frequency source 53.

In the circuit, the output of frequency comparator 51 is taken to the attenuation and VCO control circuit 56. The control circuit gives two output signals, of which the VCO Cntrl output signal is taken to the VCO control input IN2, where it regulates the oscillator output frequency or frequency range. The task of the AttenuationCntrl output signal is to bring about attenuation in the VCO control variable. The attenuation may be implemented in the phase comparator, in the VCO or in the loop filter. If the loop filter has a big DC amplification, it is preferable to implement the attenuation either in the filter or in the oscillator. If the attenuation is implemented in the phase comparator or in the VCO, then the attenuation control lines are as shown by the dashed line. In this embodiment the attenuation is implemented in the loop filter (the control line is a solid line), whereby the AttenuationCntrl signal regulates the VCO input signal.

Figure 5:
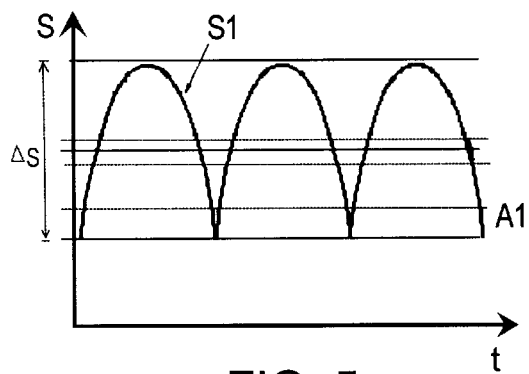
FIG. 5 shows a signal arriving at a loop filter.

The operation of the circuit will now be described step by step with the aid of FIGS. 4 and 5–7. FIG. 5 shows the VCO's input signal, when the PLL is not locked, e.g. in a situation where the DATA input signal has returned after a blackout. In such a situation the loop looks for locking, and the VCO input signal S1, FIG. 5, oscillates from one side to the other of its variation range ΔS.

In a state-of-the-art solution, the loop is locked to the DATA input signal, if VCO is regulated to the input signal frequency. However, since the characteristic of the integrated oscillator is not exactly known, the result in a locked state may be such that locking has taken place in the lower part of the linear range of regulation of the control voltage at point A2, FIG. 6. The final result is that the PLL has a non-existent scope of frequency regulation downwards, and if the input signal frequency drops, it can no longer be tracked. The situation resembles the situation which was described earlier and which is shown in FIG. 1, wherein the location at the locking frequency is at point A of the second lowest curve and not at point B of the lowest curve, where there would be a sufficient scope of regulation on both sides.

Figure 7:
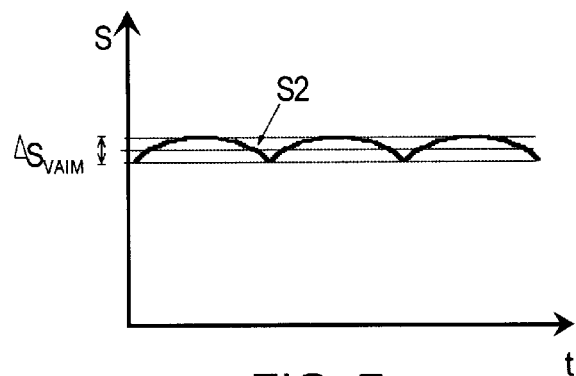
FIG. 7 shows a signal after a loop filter.
Figure 6:
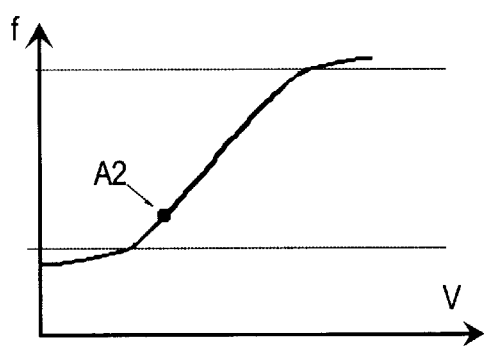
FIG. 6 shows an oscillator characteristic.

In a circuit according to the invention shown in FIG. 4, the procedure is such that during locking the loop is forced to the middle of its regulating voltage range irrespective of any divergence in oscillator characteristics. This is done by controlling filter 54 to attenuate the amplitude of its output signal to a fraction of the original range of variation so that the mean value of the attenuated output signal S2, FIG. 7, is in the middle of VCO's linear range of regulation. At the same time, a control voltage is supplied to VCO's second control input IN2 to force the oscillator approximately to the correct frequency. When the oscillator has attained this, the attenuation of the filter output signal is removed, so that the signal is able without any attenuation to affect the control input of the oscillator. The loop will now lock quickly in the middle area of the non-attenuated control signal at a point corresponding to the nominal phase difference of the input signals of phase comparator 52.

The AttenuationCntrl and VCO Cntrl controls of filter 54 and the control input IN2 of the VCO oscillator 55 are formed in the attenuation and VCO control block 56. The operation of block 56 will be described more closely referring to FIGS. 8–9. The block input is the output signal of frequency window comparator 51. Inputs of the frequency window comparator are the output signal $f_{VCO}$ of oscillator 55 and the frequency $f_{REF}$ obtained from reference clock source 53, which is very close to the frequency of the DATA signal. A reference clock is easily available in telecommunication equipment. The output of window comparator 51 has three states, one of which indicates whether the VCO frequency is higher than the reference frequency, state two indicates that the frequencies are equal or acceptably close to each other and state three indicates that the VCO frequency is lower than the reference frequency. The essential thing to note is that state two indicates that the difference between input frequencies of the window comparator is within a predetermined frequency window.

When the loop is started and locking is sought to the DATA signal, VCO's output frequency $f_{VCO}$ is e.g. lower than $F_{REF}$. The output of frequency window comparator 51 indicates the information $f_{REF} > f_{VCO}$. The VCO and attenuation control block 56 receives the information and forms such a value for the AttenuationCntrl signal which makes filter 54 attenuate its output signal S2 so that it is e.g. 1/10th of input signal S1. The output signal is as shown in FIG. 7.

In block 56 there is also an arrangement forming a control variable VCO Cntrl so that its value will change from the established initial value. The change may be continuous or discrete. In the latter case, the arrangement may include e.g. an upwards/downwards counter which is incremented periodically for as long as the output of frequency window comparator 51 indicates the $f_{REF} > f_{VCO}$ information. The said information functions as the counter's enable input. The counter value is changed e.g. with a DA converter into a voltage to be supplied to the control input IN2 of the VCO. As the counter steps upwards, the control voltage will rise and the frequency of VCO will increase. In this way the frequency window of frequency window comparator 51 is approached from below. When VCO's output frequency $f_{VCO}$ has arrived in the frequency window, the output of frequency window comparator 51 changes from the third state to the second state, which indicates that the difference between input frequencies is acceptable. The frequency of VCO is now very close to the nominal frequency of the loop's input signal. In response to the change in the output of the frequency window comparator, the VCO and attenuation control block 56 changes the output into the AttenuationCntrl state, where the attenuation of the output signal of filter 54 is removed. At the same time, the upwards/downwards counter stops working and the value is frozen at the value of that moment. A control corresponding to this value is left to affect VCO's control input IN2.

After removal of the filter's attenuation, the oscillator oscillates almost at the correct frequency and it now receives the control variable from phase comparator 53 and from filter 54. Control signal S1 varies in accordance with FIG. 6. Owing to the operation of block 56, VCO may lock into signal S1 only at such a value of signal S1 which corresponds with the said frequency window frequency, that is, only when the VCO frequency corresponding to signal S1 is inside frequency window Δf. No more than a few S1 periods will be sufficient for locking. The result is that in the locked state the VCO control voltage is almost in the middle of its range of regulation.

Figure 8:
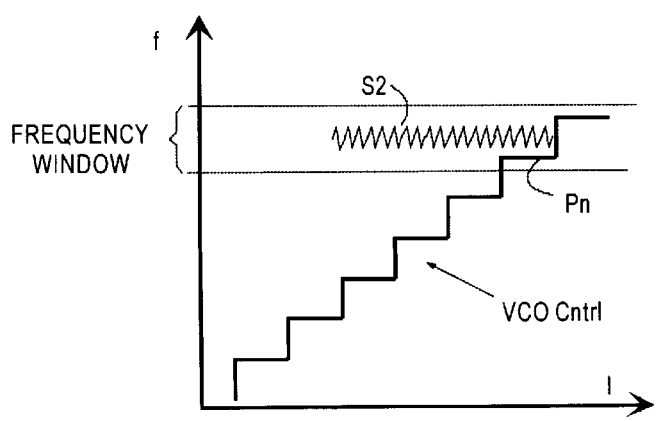
FIG. 8 shows stepwise control.

FIG. 8 illustrates such a case as an example, where the VCO and attenuation control block 56 supplies a control voltage VCO Cntrl which changes in a stepwise fashion by steps of a standard height. The voltage value of each step makes the VCO produce a frequency $f_{VCO}$ corresponding to the control voltage, so the oscillator frequency will rise in step with the control voltage steps. Frequency window comparator 51 compares the $f_{VCO}$ frequency and the $f_{REF}$ reference frequency with one another, and when the VCO frequency reaches a predetermined frequency distance from the reference frequency, the frequency comparator provides output information stating that the VCO frequency is correct. This frequency distance forms a frequency window where the upper and lower limits determine the maximum permissible difference between the VCO output frequency and the reference frequency. When the control voltage VCO Cntrl changes in a stepwise manner and it has taken n steps, such a control value is reached in step Pn where the VCO frequency has entered the window. The frequency is hereby sufficiently close to that nominal frequency of the loop's input signal at which locking is to take place. For the sake of clarity, the figures also show signal S2 which is attenuated by the filter. Its frequency is much higher than the pace of change of the control voltage steps. When the attenuation of signal S2 is removed, its amplitude will increase to be in accordance with signal S1 in FIG. 5. The loop now seeks locking to this signal. The locking lasts only for a few S1 periods and, in addition, the locking takes place in a range corresponding to the attenuated signal according to FIG. 8. This range remains between the dashed lines in FIG. 5, so the locking takes place in a controlled manner in the middle of the range of variation of signal S1, which allows for a sufficient scope of regulation in both directions.

Figure 9:
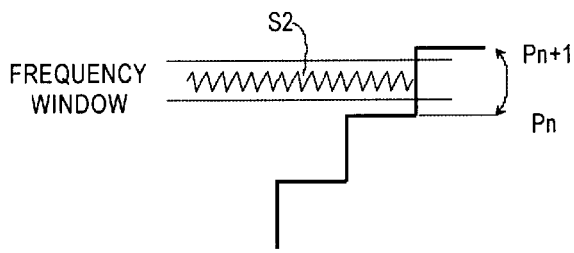
FIG. 9 shows the relation between a step and a frequency window.

The frequency window must be of such a size that it will accommodate one control step in its entirety. The importance of this matter is illustrated in FIG. 9. When the control provided by step Pn is such that the VCO frequency is not yet in the frequency window, the frequency comparator will give "low frequency" information. The control is increased to the following step Pn+1 and hereby the frequency comparator gives "too high frequency" information. The control is reduced to step Pn, whereupon the event is repeated. The VCO output frequency thus alternates between frequencies corresponding to the Pn and Pn+1 controls, and the phase lock loop will not lock.

It has been described in the above description how the filter's output signal is attenuated to a fraction and the attenuated ripple is taken to the oscillator. The ripple could also be attenuated entirely. If stepwise control is used hereby, the converter must have a very high resolution. By leaving a small ripple it is possible to use such a converter having a considerably smaller resolution, which is much easier to manufacture. On the other hand, the ripple should not be too big, because the loop could hereby be locked to one side of the central point of the range of regulation.

Figure 1:
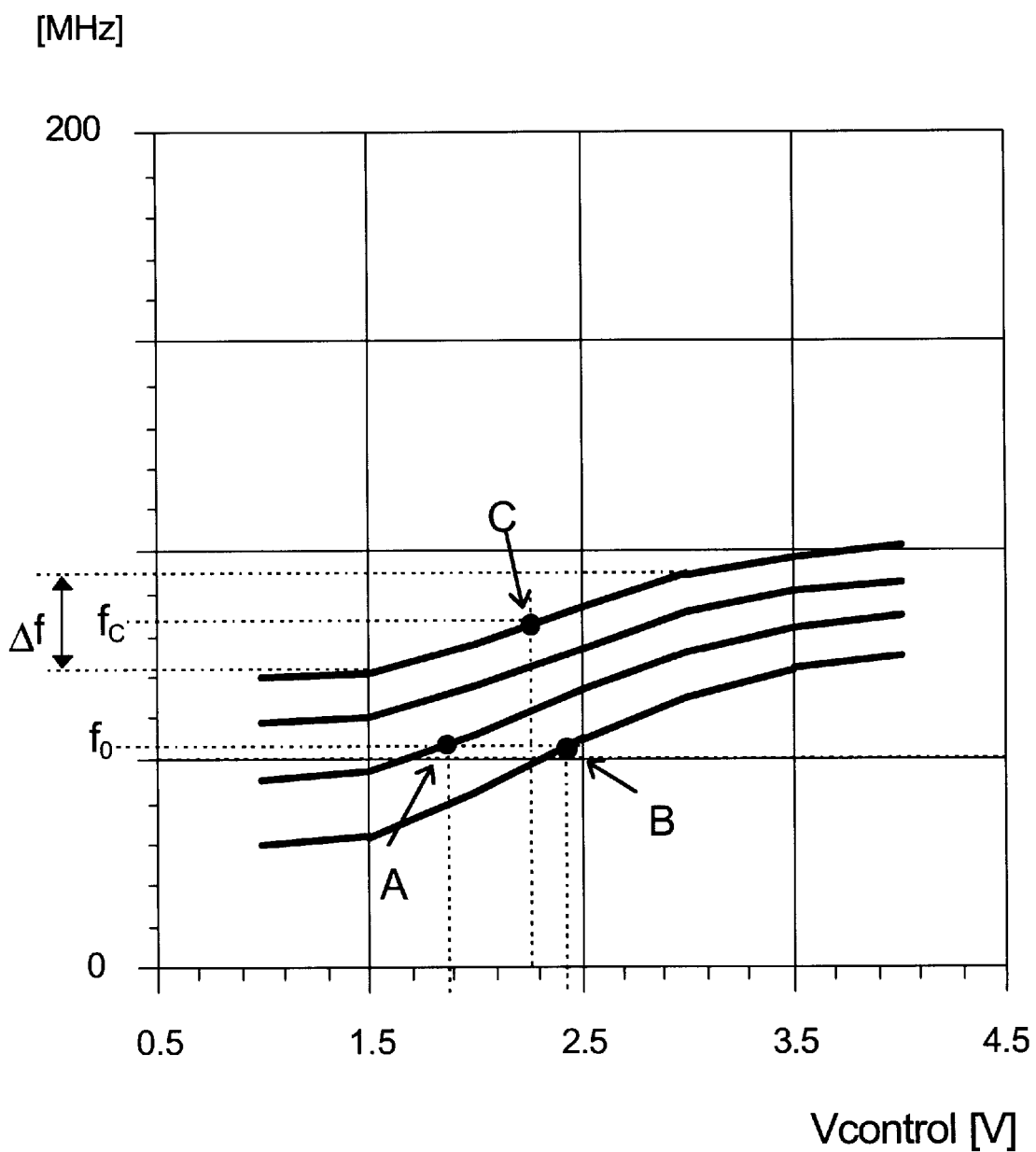
FIG. 1 shows characteristics of a voltage controlled oscillator.

Regulation of the oscillator's central frequency can also be implemented by moving the oscillator's characteristic with the aid of control input IN2. The oscillator's frequency range is regulated with this control input, and a change in the control current magnitude will make the characteristic move. The move is as shown in FIG. 1, where it is conceivable that each characteristic is brought about with values of a different control variable (e.g. bias current).

The proposed arrangement may also be implemented in such a way that the control signal to be applied to control input IN2 is used for selecting components affecting the choice of oscillator or affecting the frequency. In the integration process several oscillators with different characteristics may be made on the same piece. The control block chooses a suitable oscillator from these.

Another advantage of the arrangement according to the invention is that when the DATA input signal vanishes, the loop will produce almost the correct frequency all the time, if the control of input IN2 is frozen at a value which is in the frequency window. When the input signal then returns, the loop will lock promptly to it.

What is claimed is:

1. Method of locking the frequency of an oscillator's output signal to the frequency of a loop's input signal in a loop circuit, including
    a phase comparator producing a control variable which is proportional to the phase difference between the loop's input signal and the oscillator's output signal,
    a controlled oscillator (55) having an output signal frequency which changes in response to the control variable which is functionally connected to a control input, characterized in that during the locking:
        the oscillator's control variable is attenuated essentially so that it is in the optimum range of the range of variation of the control variable,
        an additional control is applied to the oscillator's control input, in response to which additional control the oscillator's central frequency will change,
        the oscillator's central frequency is compared to a reference signal frequency,
        the attenuation of the oscillator's control variable is removed after the oscillator's central frequency has come sufficiently close to the reference signal frequency, and
        the additional control is frozen to its value of that moment.

2. Method as defined in claim 1, characterized in that the reference signal frequency is the frequency of the loop's input signal.

3. Method as defined in claim 1, characterized in that the reference signal frequency is the frequency of a signal supplied by an external frequency source, which is close to the nominal frequency of the loop's input signal.

4. Method as defined in claim 2, characterized in that a frequency comparator is used in the comparison and that the attenuation of the control variable of the oscillator is removed when the oscillator's central frequency is equal to the reference signal frequency.

5. Method as defined in claim 3, characterized in that a frequency window comparator is used in the comparison and that the attenuation of the control variable of the oscillator is removed when the oscillator's central frequency has entered a predetermined frequency window.

6. Method as defined in claim 5, characterized in that when the oscillator's output frequency is outside the frequency window, the additional control is regulated upwards or downwards depending on whether the oscillator's central frequency is above or below the frequency window.

7. Method as defined in claim 5, characterized in that the frozen additional control is released when the oscillator's output signal has drifted outside the frequency window.

8. Method as defined in claim 5, characterized in that the additional control is released when the output signal exceeds a pre-determined frequency distance from the frequency window.

9. Method as defined in claim 5, characterized in that the additional control is regulated in a stepwise manner so that a counter is regulated in a stepwise manner upwards or downwards depending on whether the central frequency is above or below the frequency window, and the counter's topical numerical value is converted into an additional control.

10. Method as defined in claim 9, characterized in that successive additional control values corresponding to successive values of the counter are dimensioned so that they bring about such a frequency step in the oscillator's output signal which is lower than the frequency window.

11. A circuit for locking the frequency of an oscillator's (55) output signal to he frequency of a loop's input signal and including:
    a phase comparator (52) to the inputs of which an input signal and the oscillator's output signal are applied and from the output of which a signal is obtained which is proportional to the phase difference of these signals,
    a filter (54) which forms a control variable (S2) by filtering the output signal of the phase comparator,
    a controlled oscillator (55), to the control input of which the control variable (S2) is connected and the output signal ($f_{VCO}$) of which is of a frequency which will change in response to any change in the control variable,
    a frequency comparator (51) to the inputs of which a reference signal and the oscillator's output signal are applied,
    characterized in that the circuit also includes:
        an attenuation and oscillator control block (56), the input of which is connected functionally to the output of the frequency comparator (51) and from the output of which an attenuation control signal (Attenuation Cntrl) is obtained which regulates the attenuation of the oscillator's control variable, and an additional control (VCO Cntrl) which when applied to the oscillator's control input will during locking regulate the oscillator's central frequency sufficiently close to the reference signal frequency.

12. Circuit as defined in claim 11, characterized in that the reference signal is the input signal of the circuit.

13. Circuit as defined in claim 11, characterized in that the reference signal is a signal supplied by an external frequency source.

14. Circuit as defined in claim 13, characterized in that the frequency comparator is a frequency window comparator (51).

15. Circuit as defined in claim 14, characterized in that in response to the information that the frequency ($f_{VCO}$) of the oscillator's output signal is outside the frequency window, the control block (56) supplies such a value to the attenuation control signal (Attenuation Cntrl) in response to which the oscillator's control variable will be essentially attenuated.

16. Circuit as defined in claim 14, characterized in that in response to the information that the frequency ($f_{VCO}$) of the oscillator's output signal is in the frequency window, the control block (56) supplies such a value to the attenuation control signal (Attenuation Cntrl), in response to which the attenuation is removed from the oscillator's control variable.

17. Circuit as defined in claim 14, characterized in that the attenuation and oscillator control block (56) includes an upwards/downwards counter and a converter converting the counter value into an additional oscillator control (VCO Cntrl).

18. Circuit as defined in claim 17, characterized in that in response to the information in the control block's (56) input that the frequency ($f_{VCO}$) of the oscillators output signal is below the frequency window, the upwards/downwards counter will step upwards.

19. Circuit as defined in claim 17, characterized in that in response to the information in the control block's (56) input that the frequency ($f_{VCO}$) of the oscillator's output signal is above the frequency window, the upwards/downwards counter will step downwards.

20. Circuit as defined in claim 17, characterized in that in response to the information in the control block's (56) input that the frequency ($f_{VCO}$) of the oscillator's output signal is in the frequency window, the upwards/downwards counter will remain at its value of that moment.

21. Circuit as defined in claim 17, characterized in that successive additional oscillator controls (Pn, Pn+1) converted by the converter and corresponding to successive counter values cause such frequency hopping in the oscillator's output signal which is smaller than the width of the frequency window.

22. Circuit as defined in claim 11, characterized in that the attenuation control signal (Attenuation Cntrl) obtained from the control block's (56) output is connected to the filter (54) which in response to the control signal will attenuate the control variable (1) essentially.

* * * * *